(12) United States Patent
Chiba et al.

(10) Patent No.: US 11,538,715 B2
(45) Date of Patent: Dec. 27, 2022

(54) STAGE AND SUBSTRATE PROCESSING APPARATUS

(71) Applicant: TOKYO ELECTRON LIMITED, Tokyo (JP)

(72) Inventors: Ryo Chiba, Miyagi (JP); Yasuharu Sasaki, Miyagi (JP); Akira Nagayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 322 days.

(21) Appl. No.: 16/643,263

(22) PCT Filed: Jun. 5, 2019

(86) PCT No.: PCT/JP2019/022297
§ 371 (c)(1),
(2) Date: Feb. 28, 2020

(87) PCT Pub. No.: WO2019/244631
PCT Pub. Date: Dec. 26, 2019

(65) Prior Publication Data
US 2020/0335384 A1 Oct. 22, 2020

(30) Foreign Application Priority Data
Jun. 19, 2018 (JP) .............................. JP2018-116230

(51) Int. Cl.
*H01L 21/687* (2006.01)

(52) U.S. Cl.
CPC .. *H01L 21/68735* (2013.01); *H01L 21/68742* (2013.01); *H01L 21/68785* (2013.01)

(58) Field of Classification Search
CPC ......... H01L 21/68735; H01L 21/68742; H01L 21/68785
See application file for complete search history.

(56) References Cited

U.S. PATENT DOCUMENTS

| 2001/0054389 A1* | 12/2001 | Sago ................... C23C 16/4586 118/500 |
| 2011/0222038 A1* | 9/2011 | Yamashita ............ C23C 16/511 355/72 |

FOREIGN PATENT DOCUMENTS

| JP | 2000-195935 A | 7/2000 |
| JP | 2009-224526 A | 10/2009 |
| JP | 2015-23160 A | 2/2015 |

\* cited by examiner

*Primary Examiner* — Kaitlin S Joerger
(74) *Attorney, Agent, or Firm* — Nath, Goldberg & Meyer; Jerald L. Meyer; Tanya E. Harkins

(57) ABSTRACT

The present invention provides a stage which comprises: a plate-shaped member having a mounting surface on which a workpiece to be processed is mounted and a rear surface facing the mounting surface, said plate-shaped member being provided with a through hole that penetrates through the mounting surface and the rear surface; and an embedded member disposed inside the through hole. This stage is configured such that the surface of the embedded member is provided with at least one of a concave portion and a convex portion.

9 Claims, 9 Drawing Sheets

Comparative Example

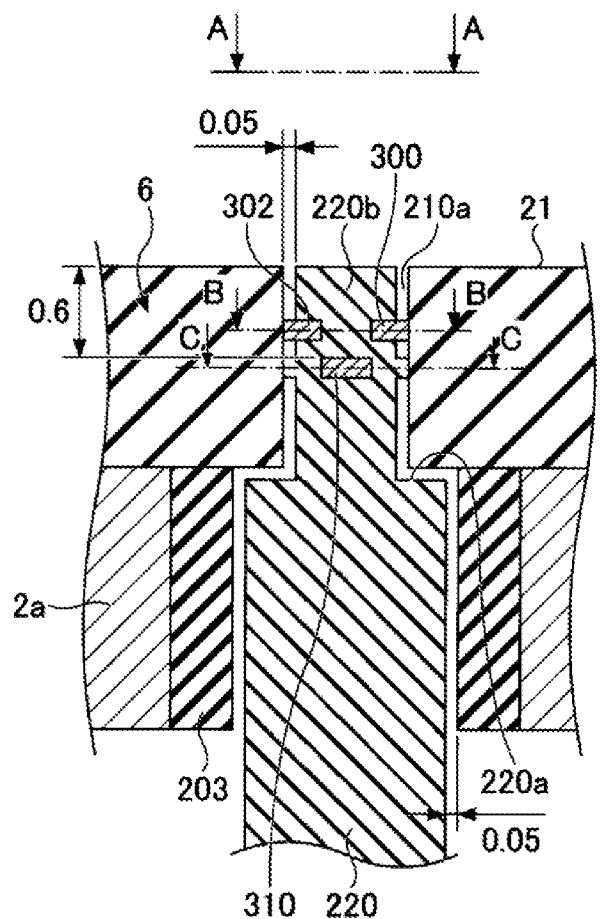

A-A Plane

B-B Plane

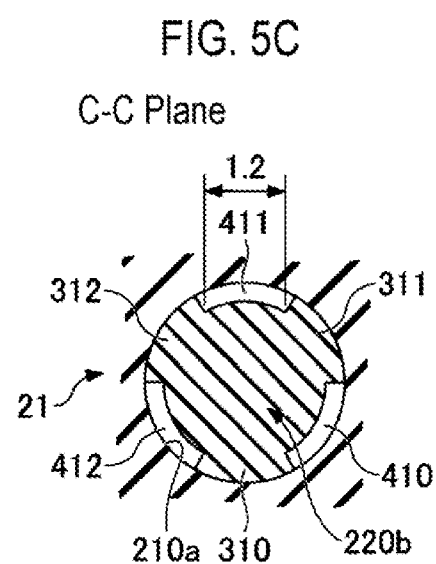

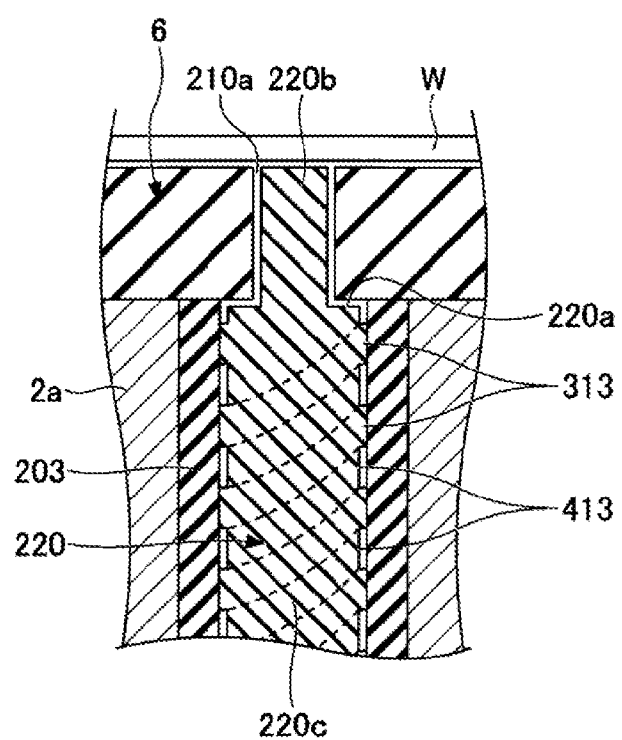

STAGE AND SUBSTRATE PROCESSING APPARATUS

TECHNICAL FIELD

The present disclosure relate to a stage and a substrate processing apparatus.

BACKGROUND

A substrate processing apparatus that performs etching processing or the like on a workpiece such as a wafer using plasma has been known (see, e.g., Patent Document 1). Such a plasma processing apparatus includes a stage, which is configured to hold and support a workpiece thereon and serves as an electrode, in a processing container capable of forming, for example, a vacuum space therein. The stage is provided with a through hole for supplying a heat transfer gas to a space between the rear surface of the workpiece held on the stage and the mounting surface of the stage.

PRIOR ART DOCUMENT

Patent Document

Patent Document 1: Japanese Laid-Open Patent Publication No. 2000-195935

SUMMARY

The present disclosure provides a technology capable of suppressing abnormal discharge in a stage.

According to one embodiment of the present disclosure, there is provided a stage including a plate-shaped member having a mounting surface on which a workpiece is mounted, a rear surface facing the mounting surface, and a through hole penetrating through the mounting surface and the rear surface; and an embedded member disposed inside the through hole, wherein at least one of a concave portion and a convex portion is provided on a surface of the embedded member.

According to an aspect, it is possible to suppress abnormal discharge in a stage.

BRIEF DESCRIPTION OF DRAWINGS

FIGS. 4A and 4B are views illustrating an exemplary embedded member according to an embodiment.

FIGS. 5A to 5C are views illustrating a plan view of an embedded member and an exemplary cross section of the embedded member according to an embodiment.

FIGS. 6A and 6B are views illustrating an exemplary embedded member according to an embodiment.

DETAILED DESCRIPTION

Figure 1:
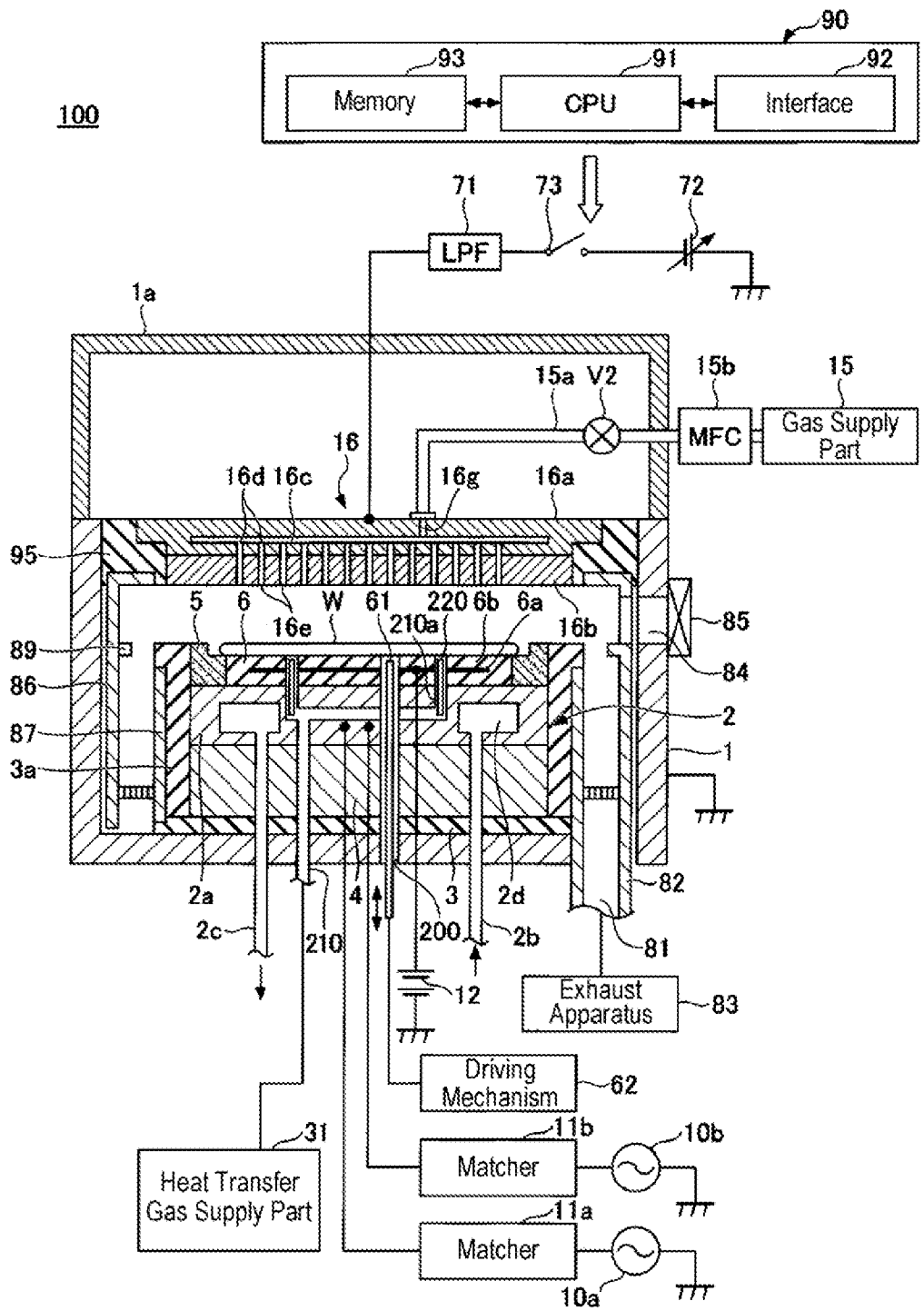
FIG. 1 is a view illustrating an exemplary configuration of a substrate processing apparatus according to an embodiment.

Hereinafter, embodiments for executing the present disclosure will be described with reference to drawings. In the specification and drawings, constituent elements that are substantially the same will be denoted by the same reference numerals, and redundant descriptions will be omitted.

[Configuration of Substrate Processing Apparatus]

FIG. 1 is a vertical cross-sectional view schematically illustrating an exemplary configuration of a wafer processing apparatus 100 according to the present embodiment. The substrate processing apparatus 100 includes a processing container 1 that is airtightly configured and electrically set to a ground potential. The processing container 1 has a cylindrical shape, and is made of, for example, aluminum or the like. The processing container 1 defines a processing space in which plasma is generated. A stage 2 supporting thereon a wafer W, which is an example of a workpiece, is installed in the processing container 1. The stage 2 has a base 2a and an electrostatic chuck (ESC) 6. The base 2a is made of a conductive metal, such as aluminum, and has a function as a lower electrode. The electrostatic chuck 6 is made of ceramics, such as alumina, and has a function for electrostatically attracting a wafer W. The stage 2 is supported on a support table 4. The support table 4 is supported by a support member 3 made of, for example, quartz. An edge ring 5 made of, for example, silicon is provided on an outer periphery of an upper portion of the stage 2. In the processing container 1, a cylindrical inner wall member 3a made of, for example, quartz is installed to surround the peripheries of the edge ring 5, the stage 2, and the support table 4.

The base 2a is connected to a first RF power supply 10a via a matcher 11a and to a second RF power supply 10b via a matcher 11b. The first RF power supply 10a supplies high-frequency power for plasma generation having a predetermined frequency to the base 2a. The second RF power supply 10b supplies a high-frequency power for ion attraction (for bias) having a predetermined frequency lower than the frequency of the first RF power supply 10a to the base 2a.

Above the stage 2, a shower head 16 facing the stage 2 in parallel and having a function as an upper electrode is provided. With such a configuration, the shower head 16 and the stage 2 function as a pair of electrodes.

The electrostatic chuck 6 includes an electrode 6a inserted in an insulator 6b, and a DC power supply 12 is connected to the electrode 6a. When a DC voltage is applied to the electrode 6a from the DC power supply 12, the wafer W is attracted by a Coulomb force. The stage 2 may not have the electrostatic chuck 6.

A coolant flow path 2d is formed inside the stage 2. A coolant inlet pipe 2b and a coolant outlet pipe 2c are connected to the coolant flow path 2d. The stage 2 is controlled to a predetermined temperature by circulating an appropriate coolant, such as cooling water, in the coolant flow path 2d.

A gas supply pipe 210 for supplying a cold heat transfer gas such as helium gas (hereinafter, also referred to as a "heat transfer gas") to the rear surface of a wafer W is installed to penetrate through the stage 2 and the like. The gas supply pipe 210 is connected to a heat transfer gas supply part 31. The gas supply pipe 210 penetrates through the stage 2, and thus a through hole 210a is formed inside the stage 2. With this configuration, the temperature of the wafer W on the stage 2 is controlled to a predetermined temperature.

An embedded member 220 is disposed inside the through hole 210a, and suppresses abnormal discharge in the stage 2. The details of the internal structure of the gas supply pipe 210 will be described later. The stage 2 is provided with a plurality of (e.g., three) pin penetration holes 200 (only one of which is illustrated in FIG. 1). A lifter pin 61 is provided inside each of the pin penetration holes 200. The lifter pin 61 is connected to a driving mechanism 62 and is moved up and down by the driving mechanism 62.

The shower head 16 is installed in a ceiling wall portion of the processing container 1. The shower head 16 includes a main body 16a and an upper ceiling plate 16b serving as an electrode plate, and is supported on an upper portion of the processing container 1 via an insulative member 95. The main body 16a is made of a conductive material, for example, aluminum having an anodized surface, and detachably supports the upper ceiling plate 16b therebelow.

A gas diffusion chamber 16c is provided inside the main body 16a. A number of gas flow holes 16d are formed in a lower portion of the main body 16a so as to be located below the gas diffusion chamber 16c. Gas introduction holes 16e penetrate through the upper ceiling plate 16b in the thickness direction. The gas introduction holes 16e are provided so as to communicate with the gas flow holes 16d.

A gas inlet port 16g for introducing a processing gas into the gas diffusion chamber 16c is formed in the main body 16a. One end of a gas supply pipe 15a is connected to the gas inlet port 16g. A gas supply part 15 for supplying a processing gas is connected to the other end of the gas supply pipe 15a. A mass flow controller (MFC) 15b and an opening/closing valve V2 are installed in the gas supply pipe 15a in this order from the upstream side. A processing gas for plasma etching is supplied from the gas supply part 15 to the gas diffusion chamber 16c via the gas supply pipe 15a. With this configuration, the processing gas supplied to the gas diffusion chamber 16c is dispersed in the form of a shower and supplied into the processing container 1 through the gas flow holes 16d and the gas introduction holes 16e.

A variable DC power supply 72 is electrically connected to the shower head 16 via a low-pass filter (LPF) 71. The variable DC power supply 72 is configured to be capable of turning on/off power supply by an on/off switch 73. The current/voltage of the variable DC power supply 72 and the on/off of the on/off switch 73 are controlled by a controller 90. When high-frequency (RF) waves are applied to the stage 2 from the first RF power supply 10a and the second RF power supply 10b and plasma is generated in the processing space, the on/off switch 73 is turned on by the controller 90 as necessary and a predetermined DC voltage is applied to the shower head 16.

A cylindrical ground conductor 1a is provided so as to extend from a sidewall of the processing container 1 to a position above the height position of the shower head 16. The cylindrical ground conductor 1a has a ceiling wall on the top thereof.

An exhaust port 81 is formed at a bottom portion of the processing container 1. An exhaust apparatus 83 is connected to the exhaust port 81 via an exhaust pipe 82. The exhaust apparatus 83 has a vacuum pump, and operates the vacuum pump so as to reduce an internal pressure of the processing container 1 to a predetermined degree of vacuum. A loading/unloading port 84 for a wafer W is provided in the sidewall of the processing container 1, and the loading/unloading port 84 is provided with a gate valve 85 configured to open/close the loading/unloading port 84.

A deposition shield 86 is provided near an inner sidewall of the processing container 1 along the inner wall surface of the processing container 1. The deposition shield 86 prevents etching-by-product (deposition) from adhering to the processing container 1. At a height position substantially the same as the wafer W, the deposition shield 86 is provided with a conductive member (a GND block) 89, which is connected such that the potential thereof with respect to the ground is controllable, thereby preventing abnormal discharge. In addition, a deposition shield 87 extending along the inner wall member 3a is provided. The deposition shields 86 and 87 are detachable.

The overall operations of the substrate processing apparatus 100 having the above configuration is controlled by the controller 90. The controller 90 includes a CPU 91 that controls each component of the substrate processing apparatus 100, an interface 92, and a memory 93.

The interface 92 includes, for example, a keyboard configured to allow a process manager to input commands in order to manage the substrate processing apparatus 100 therethrough, and a display configured to visualize and display an operation situation of the substrate processing apparatus 100.

The memory 93 stores control programs for implementing various processes executed in the substrate processing apparatus 100 under the control of the CPU 91, and recipes storing, for example, processing condition data. Then, if necessary, predetermined processing is performed in the substrate processing apparatus 100 by calling an arbitrary recipe from the memory 93 using, for example, an instruction corresponding to an input operation from the interface 92 and causing the CPU 91 to execute the recipe. In addition, the control programs and the recipes of, for example, processing condition data may be used in the state of being stored in a computer storage medium (e.g., a hard disc, a CD, a flexible disc, or semiconductor memory) that is capable of being read by a computer. The control programs or the recipes of, for example, processing condition data may be transmitted from another device at any time through, for example, a dedicated line and used online.

[Configuration of Stage]

Figure 2:
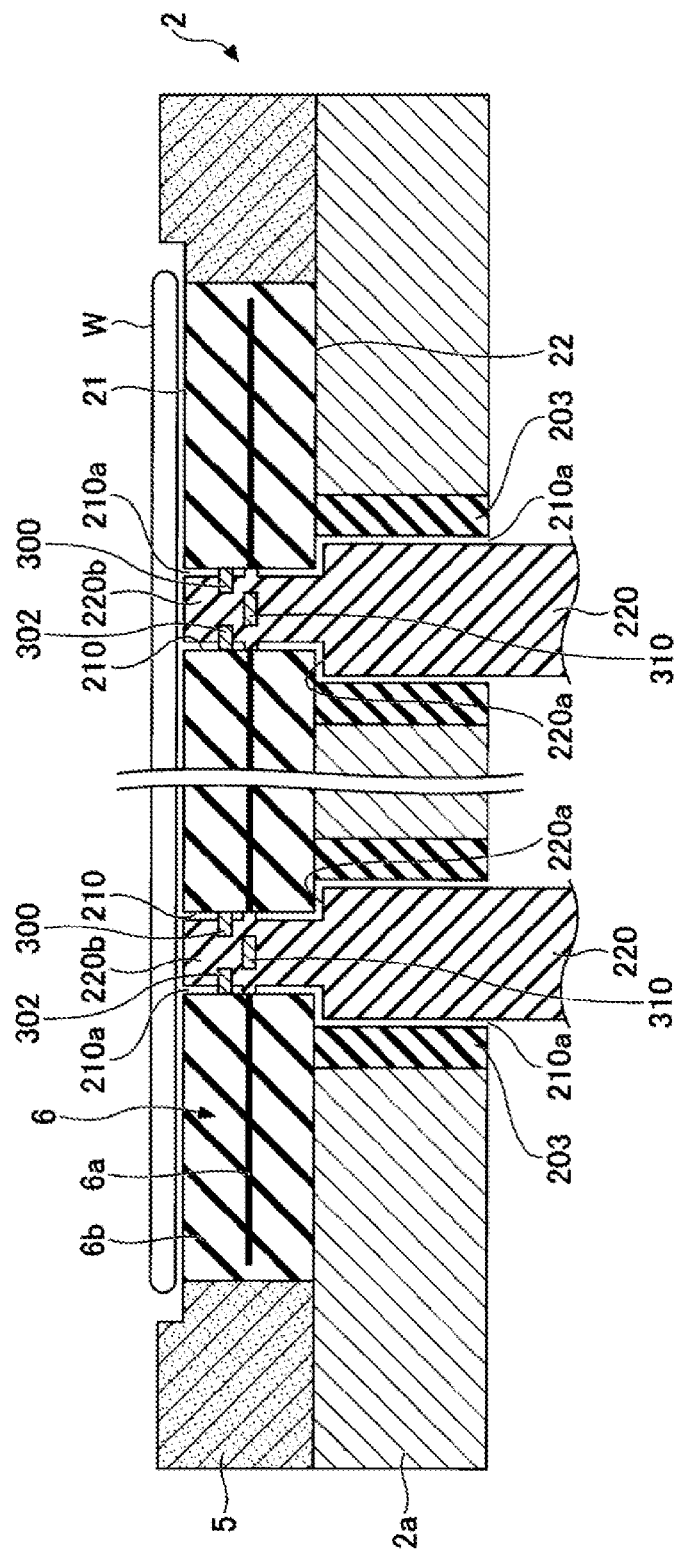
FIG. 2 is a schematic cross-sectional view illustrating an exemplary configuration of a stage according to an embodiment.

Next, an exemplary configuration of a stage 2 will be described with reference to FIG. 2. FIG. 2 is a schematic sectional view illustrating a stage 2 according to the present embodiment. As described above, the stage 2 includes the base 2a and the electrostatic chuck 6. The electrostatic chuck 6 having a circular plate shape includes a mounting surface 21 on which a disk-shaped wafer W is mounted, and a rear surface 22 facing the mounting surface 21. The base 2a is bonded to the rear surface 22 of the electrostatic chuck 6. When the stage 2 does not have the electrostatic chuck 6, the top surface of the base 2a may be the mounting surface 21 of the stage 2, and the bottom surface of the base 2a may be the rear surface 22 of the stage 2.

An end portion of the gas supply pipe 210 is formed in the mounting surface 21 to form a through hole 210a. A heat transfer gas such as helium gas is supplied to the rear surface of the wafer W from the through hole 210a. The through hole 210a is provided to penetrate through the stage 2.

The electrostatic chuck 6 is an example of a plate-shaped member having a mounting surface 21 on which a wafer W is mounted, a rear surface 22 facing the mounting surface 21, and a through hole 210a formed to penetrate the mounting surface 21 and the rear surface 22. When the stage 2 does not have the electrostatic chuck 6, the base 2a or a member replacing the electrostatic chuck provided on the base 2a may become an example of the plate-shaped member having a mounting surface 21, a rear surface 22 facing the mounting surface 21, and a through hole 210a formed to penetrate the mounting surface 21 and the rear surface 22.

The through hole 210a has a stepped portion, and a hole diameter of the through hole 210a above the stepped portion is smaller than a hole diameter of the through hole 210a below the stepped portion. The gas supply pipe 210 is provided with a gas sleeve 203 made of alumina. A spacer may be provided on an inner wall of the gas supply pipe 210.

[Embedded Member]

An embedded member 220 is disposed inside the through hole 210a. A stepped portion 220a is formed in the embedded member 220. A diameter of the embedded member 220 above the stepped portion 220a is smaller than the diameter below the stepped portion 220a, and the longitudinal section of the embedded member 220 has a convex shape. An upper portion of the embedded member 220 above the stepped portion 220a is also referred to as a "tip end portion", and a lower portion of the embedded member 220 below the stepped portion 220a is also referred to as a "base end portion".

The embedded member 220 is formed of a plasma-resistant material such as ceramics. For example, the embedded member 220 may be formed of any of quartz, silicon carbide, silicon nitride, aluminum oxide, aluminum nitride, yttria, titanium oxide, and tungsten carbide. In addition, the embedded member 220 may be formed of a material that is less plasma-resistant than the above-mentioned materials, for example, any of silicon, tungsten, titanium, silicone, Teflon (registered trademark), elastomer, and fluororesin.

The diameter of the embedded member 220 is smaller than the diameter of the through hole 210a. Thus, the embedded member 220 is disposed at a predetermined distance from the inner wall of the gas supply pipe 210, and a heat transfer gas path is formed inside the through hole 210a.

The stepped portion 220a may have a recess in order to ensure a heat transfer gas path through which the heat transfer gas flows. However, when the width of the heat transfer gas path in the stepped portion 220a is unnecessarily increased, abnormal discharge may occur. Therefore, the width of the recess provided in the stepped portion 220a may be a width that is capable of securing the heat transfer gas path even when the embedded member 220 is shifted in the lateral direction.

In the substrate processing apparatus 100, the high-frequency (RF) power applied to the stage 2 has a higher voltage. When the high-frequency power applied to the stage 2 has the higher voltage, abnormal discharge may occur near the through hole 210a.

That is, in the substrate processing apparatus 100, when high-frequency power is applied to the stage 2, an electrical potential difference is generated between the wafer W and the rear surface 22 of the electrostatic chuck 6 due to the capacitance of the electrostatic chuck 6. As a result, when the electrical potential difference of the RF potential generated in the through hole 210a exceeds a limit value at which discharge occurs, abnormal discharge occurs.

Figure 3:
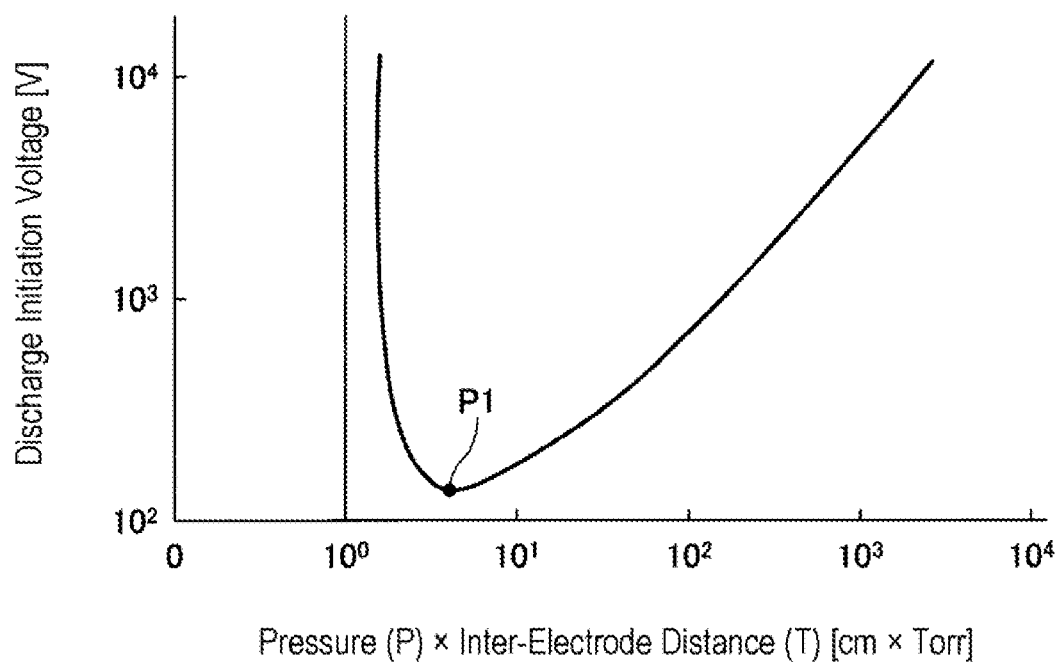
FIG. 3 is a graph representing a curve of discharge initiation voltage according to Paschen's law.

According to a curve of discharge initiation voltage according to Paschen's law shown in FIG. 3, the minimum value P1 is P×T in which P represents the pressure at which discharge is most likely to occur and T represents an inter-electrode distance. Accordingly, by avoiding the minimum value P1, the discharge initiation voltage is increased, and it is possible to make the discharge difficult.

For example, in the curve on the left side of the minimum value P1, when the pressure is constant, the shorter the inter-electrode distance T, the higher the discharge initiation voltage and thus the more difficult the discharge. Therefore, in the present embodiment, by disposing the embedded member 220 inside the through hole 210a, the inter-electrode distance represented in FIG. 3 is shortened, and the value of pressure×inter-electrode distance is made far from the minimum value P1, thereby preventing abnormal discharge. However, since it is necessary to form a flow path (gap) for flowing the heat transfer gas between the through hole 210a and the embedded member 220, the gap increases the inter-electrode distance, and discharge occurs easier when the value of pressure×inter-electrode distance represented on the horizontal axis in FIG. 3 approaches the value of minimum value P1×inter-electrode distance.

Therefore, in the present embodiment, in addition to providing the embedded member 220 in the through hole 210a, the embedded member 220 has a labyrinth structure having a plurality of protrusions 300, 302, 310 and the like on the tip end portion 220b. As a result, the straight distance of electrons within the through hole 210a is shortened, and occurrence of abnormal discharge is reliably prevented.

[A Plurality of Protrusions]

Figure 4A:
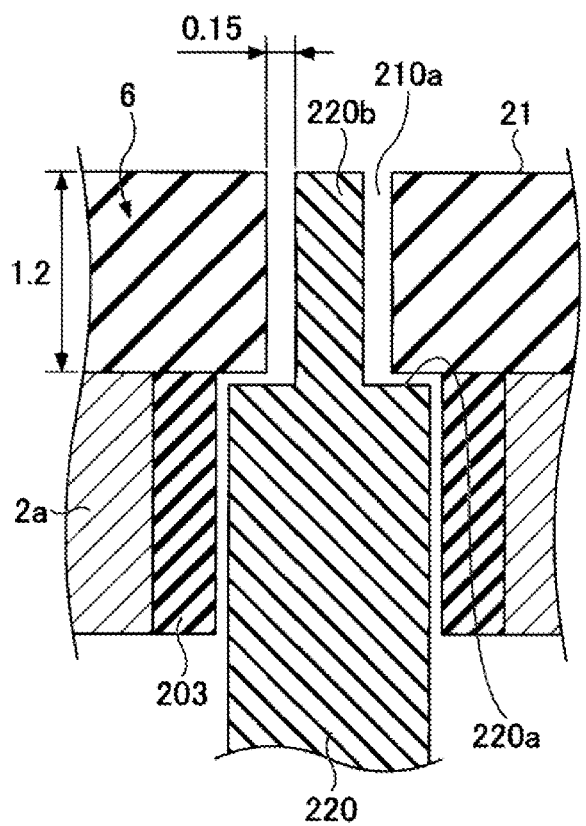

For example, embedded members 220 of a comparative example of FIG. 4A and the present embodiment of FIG. 4B will be comparatively described. In the comparative example, an annular gap of about 0.15 mm is provided in the radial direction between the tip end portion 220b of the embedded member 220 and the inner wall of the through hole 210a. The vertical gap between the tip end portion 220b and the inner wall of the through hole 210a is equal to the thickness of the electrostatic chuck 6, and is about 1.2 mm. Accordingly, in the comparative example, the longest straight distance of electrons in the tip end portion 220b is about 1.2 mm.

In contrast, in the present embodiment of FIG. 4B, a gap of about 0.05 mm is provided in the radial direction between the tip end portion 220b of the embedded member 220 and the inner wall of the through hole 210a. From the viewpoint of preventing abnormal discharge, the radial gap between the embedded member 220 and the inner wall of the through hole 210a may be about 0.05 mm or less.

In the present embodiment, a plurality of protrusions 300, 302, and 310 are arranged in two different layers of an upper layer and a lower layer. FIG. 4B is an example of an embedded member 220 in which the plurality of protrusions are alternately formed in two or more layers. In the present embodiment, the plurality of protrusions are provided in two layers, but are not limited thereto. The plurality of protrusions may be alternately arranged in three or more layers.

As described above, in the present embodiment, the plurality of protrusions 300, 302, 310 and the like of the two layers alternately protrude from the tip end portion 220b of the embedded member 220 in the radial direction. With such a configuration, in the present embodiment, there is no opening larger than about 0.05 mm between the inner wall of the through hole 210a and the embedded member 220 in plan view. The plurality of protrusions may be alternately formed in two or more layers.

Figure 5A:
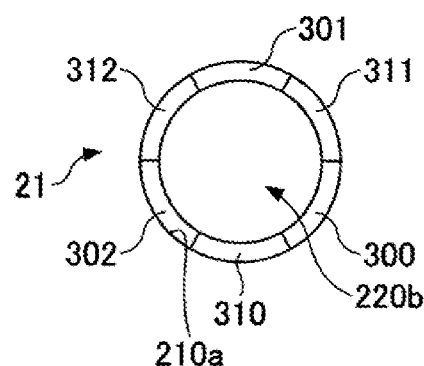
Figure 5B:
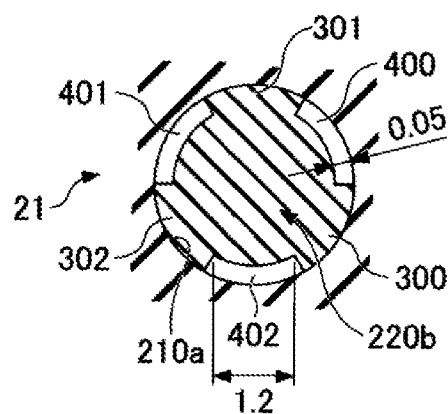

FIG. 5A is an exemplary plan view of the through hole 210a and the mounting surface 21 viewed from the A-A plane indicated in FIG. 4B. FIG. 5B is a view illustrating an exemplary cross section taken along the line B-B indicated in FIG. 4B, that is, a surface obtained by cutting upper-layer protrusions formed on the tip end portion 220b. FIG. 5C is a view illustrating an exemplary cross section taken along the line C-C indicated in FIG. 4B, that is, a surface obtained by cutting lower-layer protrusions formed on the tip end portion 220b.

In the B-B cross section in FIG. 5B, three protrusions 300, 301, and 302 radially protruding from the tip end portion 220b are formed at regular intervals, and gaps 400, 401, and 402 having a width of about 0.05 mm in the radial direction are formed therebetween. The circumferential intervals between the gaps 400, 401, and 402 are about 1.2 mm or less.

In the C-C cross section in FIG. 5C, three protrusions 310, 311, and 312 radially protruding from the tip end portion 220b are formed at regular intervals, and gaps 410, 411, and 412 having a width of about 0.05 mm in the radial direction are formed therebetween. The circumferential intervals between the gaps 410, 411, and 412 are about 1.2 mm or less.

The plurality of protrusions 300, 301, and 302 and the plurality of protrusions 310, 311, and 312 are alternately arranged in different layers. The three protrusions 300, 301, and 302 are positioned above the three gaps 410, 411, and 412, respectively. The three protrusions 310, 311, and 312 are positioned below the three gaps 402, 400, 401, respectively.

The protrusions 310, 311, and 312 are arranged below positions obtained by rotating respective protrusions 300, 301, and 302 clockwise by 60 degrees. As a result, as illustrated in the plan view of the through hole 210a in FIG. 5A, the plurality of protrusions are arranged so as to completely fill the gap between the inner wall of the through hole 210a and the embedded member 220, and thus the underside of the plurality of protrusion is not visible. That is, the stage 2 according to the present embodiment does not have an opening between the inner wall of the through hole 210a and the embedded member 220 when the through hole 210a is viewed from above in a plan view.

As a result, in the present embodiment, as illustrated in FIG. 4B, the longest straight distance of electrons accelerated between the inner wall of the through hole 210a and the embedded member 220 may be reduced to the distance from the top surface of the lower layer-protrusion 310 to the mounting surface 21, that is to about 0.6 mm. However, the longest straight distance between electrons is not limited to about 0.6 mm, and may be further reduced depending on the shape, size, and arrangement of the protrusions.

From the above, in the through hole 210a formed in the stage 2 according to the present embodiment, by providing the plurality of protrusions 300, 301, 302, 310, 311, and 312, it is possible to shorten the acceleration distance of electrons in the through hole 210a. This makes it possible to suppress the acceleration of electrons in the through hole 210a, and thus prevent abnormal discharge on the rear surface of the wafer W.

The intervals between the plurality of protrusions 300, 301, 302, 310, 311, and 312 may be less than about 1.2 mm in the circumferential direction in a plan view, and may not be arranged at regular intervals. For example, between the inner wall of the through hole 210a and the embedded member 220, the plurality of protrusions may be freely arranged alternately within a range not having an opening larger than about 0.05 mm. The number of the plurality of protrusions and the number of layers on which the plurality of protrusions are arranged are not limited to the number and the number of layers in the present embodiment.

[Spiral Protrusion]

Next, other examples of the embedded member 220 according to the embodiment will be described with reference to FIGS. 6A and 6B. In the example illustrated in FIG. 6A, the tip end portion 220b of the embedded member 220 does not have a plurality of protrusions, and spiral protrusions 313 are provided on a base end portion 220c located before the stepped portion 220a, that is, on the side opposite the tip end portion 220b with respect to the stepped portion 220a. There is a gap of about 0.05 mm or less in the radial direction between the base end portion 220c and the inner wall of the through hole 210a.

Spiral gaps 413 are formed between the spiral protrusions 313. The spiral protrusions 313 protrude in the radial direction by about 0.05 mm or less. The intervals between the spiral protrusions 313 may be about 0.6 mm or less.

With this configuration, it is possible to shorten the acceleration distance of electrons by providing the spiral protrusions 313 in the through hole 210a formed in the stage 2 according to the present embodiment. This makes it possible to suppress the acceleration of electrons in the through hole 210a, and thus prevent abnormal discharge on the rear surface of the wafer W.

In addition, the tip end portion 220b of the embedded member 220 has one of the plurality of protrusions 300, 302, 310 and the like and the spiral protrusions 313, and the base end portion 220c of the embedded member 220 may have the other of the plurality of protrusions 300, 302, 310 and the like and the spiral protrusions 313. For example, FIG. 6B illustrates an example in which the tip end portion 220b has the plurality of protrusions 300, 302, 310 and the like, and the base end portion 220c has spiral protrusions 313. However, the configurations of the protrusions are not limited thereto. The tip end portion 220b may have the spiral protrusions 313, and the base end portion 220c may have the plurality of protrusions 300, 302, 310 and the like. With this configuration, it is possible to more reliably prevent abnormal discharge in the through hole 210a.

Figure 6B:
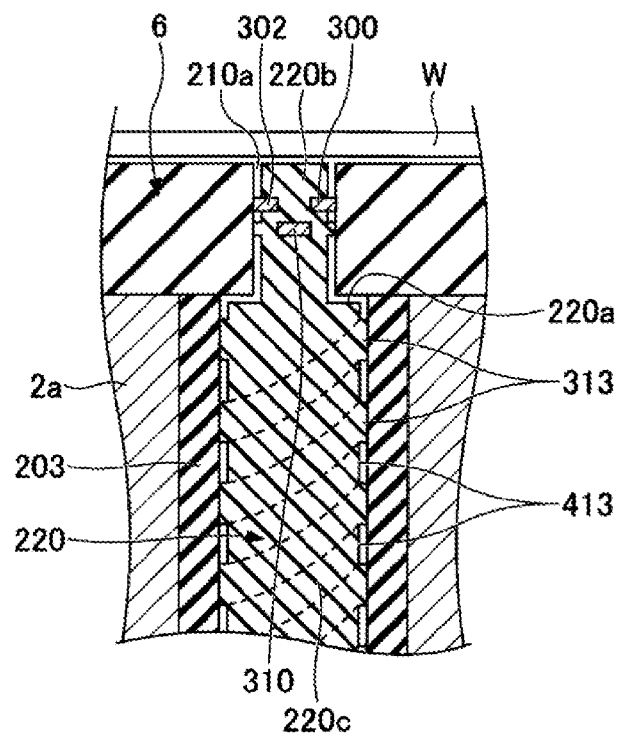

As described above, in any cases in which any of the plurality of protrusions in FIG. 4B and the spiral protrusions in FIGS. 6A and 6B are provided in the embedded member 220, openings, which exist between the protrusions in any one cross section obtained by horizontally cutting the embedded member 220, exist at different position in another cross section. The plurality of protrusions 300, 302, 310 and the like and the spiral protrusions 313 protrude in the radial direction by about 0.05 mm or less. Thus, the inner wall of the through hole 210a and the embedded member 220 are spaced apart from each other by a predetermined distance or less in a plan view. For example, it is preferable that the distance between the inner all of the through hole 210a and the embedded member 220 be about 0.05 mm or less in a plan view. This makes it possible to shorten the acceleration distance of electrons in the through hole 210a, and thus supply a heat transfer gas while preventing abnormal discharge on the mounting surface 21 of the stage 2 and the like.

From the above, with the stage 2 according to the present embodiment, it is possible to suppress abnormal discharge in the through hole 210a for supplying a heat transfer gas to a space between the rear surface of the wafer W placed on the stage 2 and the mounting surface 21 of the stage 2.

MODIFICATION EXAMPLES

The embedded member 220 provided in the stage 2 is not limited to the case where the embedded member 220 is applied to the above-described through hole 210a, which is a flow path for a heat transfer gas supplied to the rear surface 22 of a wafer W. For example, the embedded member 220 is also be applicable to the pin penetration hole 200 through which the lifter pin 61 illustrated in FIG. 1 is inserted. In this case, the plurality of protrusions may be alternately provided on the surface of the lifter pin 61, or the spiral protrusions may be provided on the surface of the lifter pin 61. However, the plurality of protrusions are provided so as not to come into contact with the inner wall of the pin penetration hole 200 such that the vertical movement of the lifter pin 61 is not hindered.

At least one of a concave portion and a convex portion may be formed on the surface of the embedded member 220. The surface of the embedded member 220 is not limited to including a plurality of protrusions, and may include a plurality of concave portions. In addition, the surface of the embedded member 220 is not limited to including a spiral protrusion, and include a spiral recess.

For example, the plurality of protrusions 300, 301, 302, 310, 311, and 312 are examples of convex portions formed on the surface of the embedded member 220. The gaps 400, 401, 402, 410, 411, and 412 are examples of concave portions formed on the surface of the embedded member 220.

In addition, for example, the spiral protrusion 313 is an example of a convex portion formed in the surface of the embedded member 220. The gap 413 is an example of a concave portion formed in the surface of the embedded member 220.

Furthermore, the concave portion or the convex portion provided on the surface of the embedded member 220 are not limited to spiral protrusions or substantially rectangular protrusions, and may have various shapes. However, even in this case, the shape and arrangement of the protrusions are determined such that the inner wall of the through hole 210a and the embedded member 220 are spaced apart from each other by a predetermined distance or less, for example, about 0.05 mm or less in a plan view.

As described above, according to the stage 2 and the substrate processing apparatus 100 including the stage 2 of the present embodiment, it is possible to prevent abnormal discharge from occurring in the stage 2.

It shall be understood that the stage and the substrate processing apparatus according to the embodiment disclosed herein are illustrative and not restrictive in all aspects. The above embodiments may be modified and improved in various forms without departing from the scope and spirit of the appended claims. The matters described in the above embodiments may take other configurations without contradiction, and may be combined without contradiction.

The substrate processing apparatus of the present disclosure is applicable to any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In this specification, a wafer W has been described as an example of a workpiece. However, the substrate is not limited thereto, and may be any of various substrates used for a flat panel display (FPD), a printed circuit board, or the like.

The present international application claims priority based on Japanese Patent Application No. 2018-116230 filed on Jun. 19, 2018, the disclosure of which are incorporated herein in its entirety by reference.

EXPLANATION OF REFERENCE NUMERALS

2: stage, 2a: base, 5: edge ring, 6: electrostatic chuck, 15: gas supply part, 16: shower head, 21: mounting surface, 22: rear surface, 31: heat transfer gas supply part, 61: lifter pin, 100: substrate processing apparatus, 200: pin penetration hole, 203: gas sleeve, 210: gas supply pipe, 220: embedded member, 210a: through hole, 220a: stepped portion, 220b: tip end portion, 220c: base end portion, 300, 301, 302, 310, 311, 312: protrusion, 313: spiral protrusion, 400, 401, 402, 410, 411, 412: gap, 413: spiral gap

What is claimed is:

1. A stage comprising:
a plate-shaped member having a mounting surface on which a workpiece is mounted, a rear surface facing the mounting surface, and a through hole penetrating through the mounting surface and the rear surface; and
an embedded member disposed inside the through hole,
wherein at least one of a concave portion and a convex portion is provided on a surface of the embedded member,
wherein the at least one of the concave portion and the convex portion on the surface of the embedded member includes a plurality of protrusions and a spiral protrusion, and
wherein the embedded member includes one of the plurality of protrusions and the spiral protrusion in a tip end portion of the embedded member, and includes the other of the plurality of protrusions and the spiral protrusion in a base end portion of the embedded member.

2. The stage of claim 1, wherein an inner wall of the through hole and the embedded member are spaced apart from each other by a predetermined distance or less in a plan view.

3. The stage of claim 2, wherein the plurality of protrusions are arranged at intervals of 1.2 mm or less in a circumferential direction.

4. The stage of claim 1, wherein the plurality of protrusions are alternately formed in two or more layers.

5. The stage of claim 1, wherein the plurality of protrusions are arranged at intervals of 1.2 mm or less in a circumferential direction.

6. The stage of claim 2, wherein the predetermined distance is 0.05 mm or less.

7. The stage of claim 1, wherein at least one of the concave portion and the convex portion on the surface of the embedded member is a concave portion or a convex portion having a width of 0.05 mm or less in a radial direction.

8. The stage of claim 1, wherein the through hole is a heat transfer gas flow path or a hole through which a lifter pin configured to hold the workpiece is inserted.

9. A substrate processing apparatus comprising:
a processing container configured to process a workpiece therein; and
a stage disposed in the processing container and configured to mount the workpiece,
wherein the stage includes:
a plate-shaped member having a mounting surface on which the workpiece is mounted, a rear surface facing the mounting surface, and a through hole penetrating through the mounting surface and the rear surface; and
an embedded member disposed inside the through hole, and
at least one of a concave portion and a convex portion is provided on a surface of the embedded member,
wherein the at least one of the concave portion and the convex portion on the surface of the embedded member includes a plurality of protrusions and a spiral protrusion, and
wherein the embedded member includes one of the plurality of protrusions and the spiral protrusion in a tip end portion of the embedded member, and includes the other of the plurality of protrusions and the spiral protrusion in a base end portion of the embedded member.

* * * * *